United States Patent
Alpert et al.

(10) Patent No.: US 6,915,361 B2
(45) Date of Patent: Jul. 5, 2005

(54) OPTIMAL BUFFERED ROUTING PATH CONSTRUCTIONS FOR SINGLE AND MULTIPLE CLOCK DOMAINS SYSTEMS

(75) Inventors: Charles Jay Alpert, Round Rock, TX (US); Soha Hassoun, Lexington, MA (US)

(73) Assignee: International Business Machines Corporation, Armonk, NY (US)

( * ) Notice: Subject to any disclaimer, the term of this patent is extended or adjusted under 35 U.S.C. 154(b) by 463 days.

(21) Appl. No.: 10/264,165

(22) Filed: Oct. 3, 2002

(65) Prior Publication Data

US 2004/0068626 A1 Apr. 8, 2004

(51) Int. Cl.$^7$ ............................................... G06F 3/00
(52) U.S. Cl. ........................................ 710/52; 711/158
(58) Field of Search ........................... 709/238; 710/52, 710/316; 711/117, 158, 159

(56) References Cited

U.S. PATENT DOCUMENTS 5,309,372 A * 5/1994 Marui et al. .................. 716/12
5,561,790 A * 10/1996 Fusaro .......................... 703/26

OTHER PUBLICATIONS

Zhou et al, "Simultaneous Routing and Buffer Insertion with Restrictions on Buffer Location", IEEE Transaction on Computer Aided Design of Integrated Circuits and Systems, vol. 19, No. 7, Jul. 2000, pp. 819–824.

van Ginneken, "Buffer Placement in Distributed RC–tree Networks for Minimal Elmore Delay", International Business Machines Corporation, Abstract, pp. 865–868.

Gupta et al, "The Elmore Delay as a Bound for RC Trees with Generalized Input Signals", IEEE Transactions on Computer–Aided Design of Integrated Circuits and Systems, vol. 16, No. 1, Jan. 1997, pp. 95–104.

Alpert et al., "Buffer Insertion with Accurate Gate and Interconnect Delay Computation", International Business Machines Corporation, Abstract, pp. 479–484.

Alpert et al., "Wire Segmenting for Improved Buffer Insertion", IBM Austin Research Laboratory, Austin, Texas, Abstract, pp. 588–593.

Alpert et al., "Steiner Tree Optimization for Buffers, Blockages, and Bays", IEEE Transactions on Computer–Aided Design of Integrated Circuits and Systems, vol. 20, No. 4, Apr. 2001, pp. 556–562.

Chelcea et al., "Robust Interfaces for Mixed–Timing Systems with Application to Latency–Insensitive Protocols", Department of Computer Science, Columbia University, Abstract, pp. 21–26.

Alpert et al., "Buffer Insertion for Noise and Delay Optimization", International Business Machines Corporation, Abstract, pp. 362–367.

* cited by examiner

*Primary Examiner*—Hiep T. Nguyen
(74) *Attorney, Agent, or Firm*—Duke W. Yee; Casimer K. Salys; Michael R. Nichols (57) ABSTRACT

A method, computer program product, and data processing system for automatically designing routing paths in an integrated circuit is disclosed. The present invention allows for the design of paths that are optimal in terms of the signal delay in circuits that may require registers for signal to travel over multiple clock cycles or in circuits that may contain multiple clock domains.

An integrated circuit die is modeled as a weighted grid graph in which the edges represent wire segments and the weights represent the delays associated with those wire segments. Designing for optimum delay involves finding a shortest path between two vertices in the grid graph using a modified single-source shortest path algorithm. Registers, buffers, and dual-clock domain synchronizers are modeled according to a labeling function that assigns components to selected vertices in the routing path for optimal results.

27 Claims, 8 Drawing Sheets

OPTIMAL BUFFERED ROUTING PATH CONSTRUCTIONS FOR SINGLE AND MULTIPLE CLOCK DOMAINS SYSTEMS

BACKGROUND OF THE INVENTION

1. Technical Field

The present invention relates generally to the automated layout of integrated circuits. In particular, the present invention is directed toward automatic generation of optimized wire routing in very large scale integration (VLSI) circuits.

2. Description of Related Art

In recent years, it has become commonplace for integrated circuit designers to build an integrated circuit layout from libraries of reusable high-level modules, sometimes referred to as "macro blocks." Proprietary macro blocks are often referred to as "intellectual property blocks" ("IP blocks"), to emphasize their relatively intangible, yet proprietary nature. Computerized integrated circuit design tools may be used to store, retrieve, and combine macro blocks into complete integrated circuits. This design philosophy of combining reusable macro blocks to produce a complex integrated circuit is known as "system-on-a-chip" (SoC) design.

Designing a "system-on-a-chip" involves designing the interconnections between macro blocks. Despite the apparent simplicity of SoC design, this is often not a trivial task. The reason for this is that the connections themselves are physical components (i.e., wires) with non-ideal properties. Like all electrical conductors, integrated circuit connections suffer from delay and signal loss due to physical properties such as resistance, capacitance, and relativistic limitations on the speed at which electrons are able to travel. In order to ensure that all components in an integrated circuit are properly synchronized to work properly, it is important to take these factors into account when designing interconnections between macro blocks to minimize signal loss and to allow operation within acceptable timing specifications.

The "Fast Path" algorithm, described in Hai Zhou, D. F. Wong, I-Min Liu, and Adnan Aziz, "Simultaneous Routing and Buffer Insertion with Restrictions of Buffer Locations," IEEE Trans. Computer Aided Design, vol. 19, pp. 819–824, July 2000, hereby incorporated by reference, is an algorithm that computes a path connecting two nodes in an integrated circuit layout, where the path is optimized for minimal delay. The Fast Path algorithm also allows for an optimal placement of buffers within the path in order to further minimize delay.

The Fast Path algorithm is based on the observation that minimization of delay in a circuit layout is a special case of the well-known problem in computer science of finding the "shortest path" in a weighted graph. In an integrated circuit, points along the surface of the integrated circuit may be thought of as vertices in a graph. The interconnections made between the points may be thought of as edges. Each possible interconnection has an associated delay value, which may be thought of as an edge weight. When this graph representation is adopted, finding a minimum-delay path between two points reduces down to the problem of finding the minimum total-weight path between the two vertices representing the two points (i.e., finding the shortest path).

Dijkstra's Algorithm, one of the true classics of computer science, is an algorithm for finding the shortest path from a single source vertex in a weighted directed graph where the weights are non-negative(such as in the case of delays). Dijkstra's Algorithm and single-source shortest-paths algorithms in general are described in Cormen, Leiserson, and Rivest, Introduction to Algorithms, MIT Press, 1990, pp. 514–532. The Fast Path algorithm is based on Dijkstra's Algorithm, and an understanding of Dijkstra's Algorithm goes a long way in helping one to understand the Fast Path algorithm and its limitations.

Dijkstra's Algorithm is what is known as a "greedy algorithm," because it exploits a property of the shortest path problem that is known as a reedy-choice property. A problem has a "greedy-choice property" if finding an optimal solution to some sub-problem (called making a "greedy choice") always yields an optimal solution to the problem as a whole. In the case of the shortest-paths problem, a subpath of the shortest path between two vertices in a graph is itself the shortest path between its end vertices.

Dijkstra's Algorithm, in its most general sense, takes as an input a graph $G=(V,E)$, where V is the set of vertices and $E \subset \{(u,v)|u,v \in V\}$ is the set of edges in the graph, a source vertex $s \in V$ and a weight function w mapping each edge with a non-negative weight value. Dijkstra's Algorithm also maintains a set S of vertices for which the shortest path has already been determined, a data structure d that maps a vertex into a current estimate of the total weight of the shortest path from the source vertex s, and a priority queue Q that contains all the vertices in V-S, keyed by their d values. The solution may be represented using a predecessor function $\pi$, mapping each vertex v to its predecessor vertex $\pi(v)$ in the shortest path from the source vertex s to vertex v. Priority queue is a data structure that allows the vertex with the lowest value of to be extracted from the data structure using an "EXTRACT_MIN" function. One particularly useful data structure that may be used to implement a priority queue is known as a "Fibonacci heap," and is described in Cormen, Leiserson, and Rivest, Introduction to Algorithms, MIT Press, 1990, pp.420–439. Pseudocode for Dijkstra's Algorithm is provided in Table I, below:

TABLE I

```
DIJKSTRA(G = (V, E), w, s) {
1.      for each vertex v ∈ V {
            d[v] ← ∞
            π[v] ← undefined
        }
        d[s] ← 0
2.      S ← ∅
        Q ← V
3.      while Q ≠ ∅ {
4.          u ← EXTRACT_MIN
            S ← S U {u}
5.          for each edge e = (u,v) ∈ E adjacent to u {
                if d[v] > d[u] + w(e) {
                    d[v] ← d[u] + w(e)
                    π[v] ← u
                }
            }
        }
}
```

In each iteration of Dijkstra's Algorithm, the vertex with the shortest estimated weight of its shortest path, u, is chosen using priority queue Q (step 4 in Table I). When the algorithm is first started, this vertex is the source vertex. Each edge $e=(u,v)$ that proceeds from u is then examined to see if the path from s to u to v has a total weight that is less than the current estimated weight d[v] of the short path from s to v (step 5). If the total weight of the path from s to u to v is lower than d[u], then d[v] and π[v] to reflect that the path from s to v through u is now the shortest known path from s to v. This modification of d[v] to reflect the shortest path currently known from s to v is the "greedy choice."

The Fast Path algorithm extends Dijkstra's Algorithm to the problem domain of integrated circuit routing. In the Fast Path algorithm, an integrated circuit is modeled as a "grid graph" $G=(V,E)$, where each vertex $v \in V$ represents a position on a Cartesian grid and each vertex v is connected to each orthogonally adjacent vertex in the Cartesian graph. Intuitively, a grid graph can be pictured as a sheet of graph paper, where the intersections between the lines are the vertices and the line segments connecting adjacent vertices are the edges. The weight of each edge in the Fast Path algorithm is the delay associated with the wire connecting the two points on the integrated circuit surface represented by the two end-vertices of the graph edge. The Fast Path algorithm also takes into account the existence of physical obstacles, such as IP blocks, that may constrain routing choices. A label function p is defined such that $p(v)=0$ if v overlaps a physical obstacle and $p(v)=1$ otherwise, for all $v \in V$.

The delay associated with a particular edge is, in the Fast Path algorithm, calculated using the Elmore delay metric. The Elmore delay metric is described in R. Gupta, B. Tutuianu, and L. T. Pileggi, "The Elmore Delay as a Bound for RC Tree with Generalized Input Signals," *IEEE Transactions on Computer Aided Design of Integrated Circuits and Systems,* vol. 16, no. 1, pp. 95–104 (January 1997), which is hereby incorporated by reference. The delay of a particular edge in a grid graph representing a circuit is affected by both the geometry of the physical conductor associated with that edge and whether any buffers have been placed at the circuit nodes represented by the edge's end vertices. The insertion of buffers along a route in an integrated circuit is one means of reducing the Elmore delay associated with that route, as described in L. P. P. P. van Ginneken, "Buffer Placement in Distributed RC-tree Networks for Minimal Elmore Delay," *Proc. Int. Symp. Circuits and Systems,* 1990, pp. 865–868.

For each edge $(u,v) \in E$, let $R(u,v)$ and $C(u,v)$ denote the capacitance and resistance of a wire connecting u to v. Let $R(g)$, $K(g)$, and $C(g)$ respectively denote the resistance, intrinsic delay, and input capacitance of each buffer $g \in B$, where B is a library of non-inverting buffers. Then the Elmore delay of each possible wire or buffer may be calculated (e.g., using a resistance-capacitance (RC) π-model to represent the wires and a switch-level model to represent the gates).

A "path" from node s to t in the grid graph G is a sequence of nodes $(s=v_1, v_2, \ldots, v_k=t)$ with an associated labeling $m(s)=g_s$, $m(t)=g_t$, and $m(v_i) \in B \cup 0$. B is the set of buffers that may be inserted on a node in the path between s ant t. $g_s$ is the driving circuit (logic gate) at s, $g_t$ is the sink circuit (logic gate) at t, and each internace node v may either have a buffer from the set B or no buffer at all, denoted by $m(v)=0$. A path is "feasible" if and only if $p(v)=1$ whenever $m(v) \in B$.

The main idea behind the Fast Path algorithm is to extend Dijkstra's shortest path algorithm to do a general labeling based on Elmore delays. The priority queue Q is used to store partial solutions to the problem as quadruples defined as follows. In priority queue Q, each quadruple $\alpha=(c,d,b,v)$ represents a partial solution to the routing problem at node v where c is the current input capacitance seen at v,d is the delay from v to t, and m is a labeling function for the buffered path from v to t. The priority queue Q is used to extract the partial solution quadruple having the minimum delay (d).

An additional optimization is obtained by "pruning" priority queue Q to eliminate inferior partial solutions. The partial solution $\alpha_1=(c_1,d_1,m_1,v)$ is said to be inferior to $\alpha_2=(c_2,d_2,m_2,v)$ if $c_1 \geq c_2$ and $d_1 \geq d_2$. Any buffered path from s to v to t that uses the subpath represented by $\alpha_1$ to go from v to t is guaranteed to be no better than a path from s to t containing the same subpath from s to v, but using the subpath represented by $\alpha_2$ to go from v to t.

Pseudocode for the Fast Path algorithm is provided in Table II below:

TABLE II

```
FASTPATH(G = (V,E),B,s,t,m') {
1.    Q ← {C(m'(t)),0,m',t)}
2.    while Q ≠ ∅ {
3.        (c,m,b,u) ← EXTRACT_MIN(Q)
4.        if c = 0 {
              return labeling m
          }
5.        if u = s {
              d' ← d + R(m(s)).c + K(m(s))
              push (0,d',m,u) onto Q and prune
              continue
          }
6.        for each (u,v) ∈ E {
              c' ← c + C(u,v)
              d' ← d + R(u, v)(c + C(u, v))/2
              push (c',d',m,v) onto Q and prune
          }
7.        if p(u) = 1 and m(u) = 0 {
8.            for each b ∈ B {
                  c' ← C(b)
                  d' ← d + R(b) . c + K(b)
                  m(u) = b
                  push (c',d',m,v) onto Q and prune
              }
          }
      }
}
```

The algorithm begins by initializing Q to hold a partial solution corresponding to the sink alone, having an initial labeling function m' representing a graph that is devoid of buffers, with the exception of the source and sink circuit which are already known (step 1). Each iteration (step 2), the partial solution having the minimum delay is extracted from Q (step 3). This partial solution is then extended to either add an edge (step 6) or a buffer from the library (steps 7 and 8). If the source is reached, the corresponding solution is pushed onto Q in step 5, and when the solution is eventually extracted from Q, the solution is returned as the optimum solution (step 4). With each addition to the queue, candidates for the current vertex are checked for inferiority and then pruned accordingly. If it is assumed the G has n vertices, $|E| \leq 4n$ (which is true for a grid graph), and $|B|=k$, the complexity of Fast Path is $O(n^2 k^2 \log nk)$.

The Fast Path algorithm thus provides a simple solution to the routing problem for a path including wires and buffers from a buffer library. The Fast Path algorithm is somewhat limited in its application, however. In a large, high-speed integrated circuit, the overall delay associated with a wiring route may exceed the circuit's clock cycle. In such a case, synchronizing elements such a registers may need to be inserted in the path. The Fast Path algorithm is not adapted for use in the situation where one or more registers may need to be inserted in the path. In addition, some circuits, particularly those utilizing a combination of IP blocks, will require that signals be transmitted between differing clock domains. Special synchronization circuitry is needed in such instances, and the Fast Path algorithm is not adapted to design optimal routing paths under those circumstances, either. Thus, a need exists for an automated system for designing optimal routing paths over multiple clock cycles of delay and in multiple clock-domain circuits.

SUMMARY OF THE INVENTION

The present invention is directed toward a method, computer program product, and data processing system for automatically designing routing paths in an integrated circuit. The present invention allows for the design of paths that are optimal in terms of the signal delay in circuits that may require registers for signal to travel over multiple clock cycles or in circuits that may contain multiple clock domains.

An integrated circuit die is modeled as a weighted grid graph in which the edges represent wire segments and the weights represent the delays associated with those wire segments. Designing for optimum delay involves finding a shortest path between two vertices in the grid graph using a modified single-source shortest path algorithm. Registers, buffers, and dual-clock domain synchronizers are modeled according to a labeling function that assigns components to selected vertices in the routing path for optimal results.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
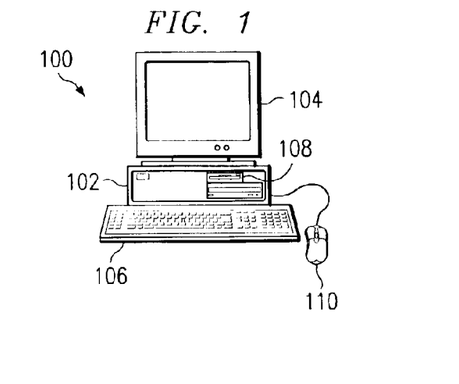
FIG. 1 is a diagram providing an external view of a data processing system in which the present invention may be implemented.

With reference now to the figures and in particular with reference to FIG. 1, a pictorial representation of a data processing system in which the present invention may be implemented is depicted in accordance with a preferred embodiment of the present invention. A computer 100 is depicted which includes system unit 102, video display terminal 104, keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like. Computer 100 can be implemented using any suitable computer, such as an IBM eServer computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface (GUI) that may be implemented by means of systems software residing in computer readable media in operation within computer 100.

Figure 2:
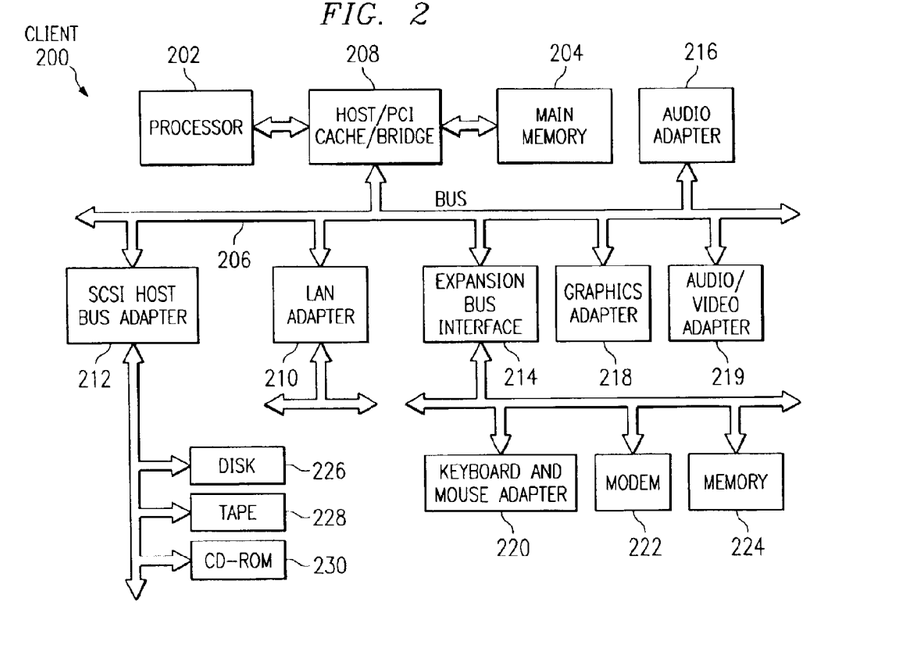
FIG. 2 is a block diagram of a data processing system in which the present invention may be implemented.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows XP, which is available from Microsoft Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash read-only memory (ROM), equivalent nonvolatile memory, or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230. In that case, the computer, to be properly called a client computer, includes some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

The processes of the present invention are performed by processor 202 using computer implemented instructions, which may be located in a memory such as, for example, main memory 204, memory 224, or in one or more peripheral devices 226–230.

The present invention is directed toward a method, computer program product, and data processing system for automatically designing routing paths in an integrated circuit. The present invention allows for the design of paths that are optimal in terms of the signal delay in circuits that may require registers for signal to travel over multiple clock cycles or in circuits that may contain multiple clock domains.

Single Clock Domain Routing with Large Delays

The Fast Path algorithm described above achieves an optimal result by finding a path in which the sum of the Elmore delay values along the path is shortest among paths between the two endpoints. When the two endpoints to be connected are sufficient far from each other to require registers to be placed along the path to, preserve synchronization, however, it is no longer possible to simply add the delay through the register to the delay stored in the partial solution (candidate) as in the Fast Path algorithm. Having a path with delay longer than the permissible clock cycle is illegal.

Figure 3:
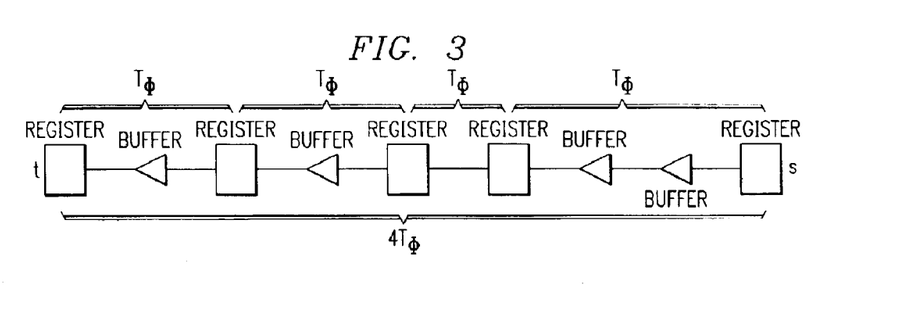
FIG. 3 is a diagram of an exemplary path containing registers.
Figure 4:
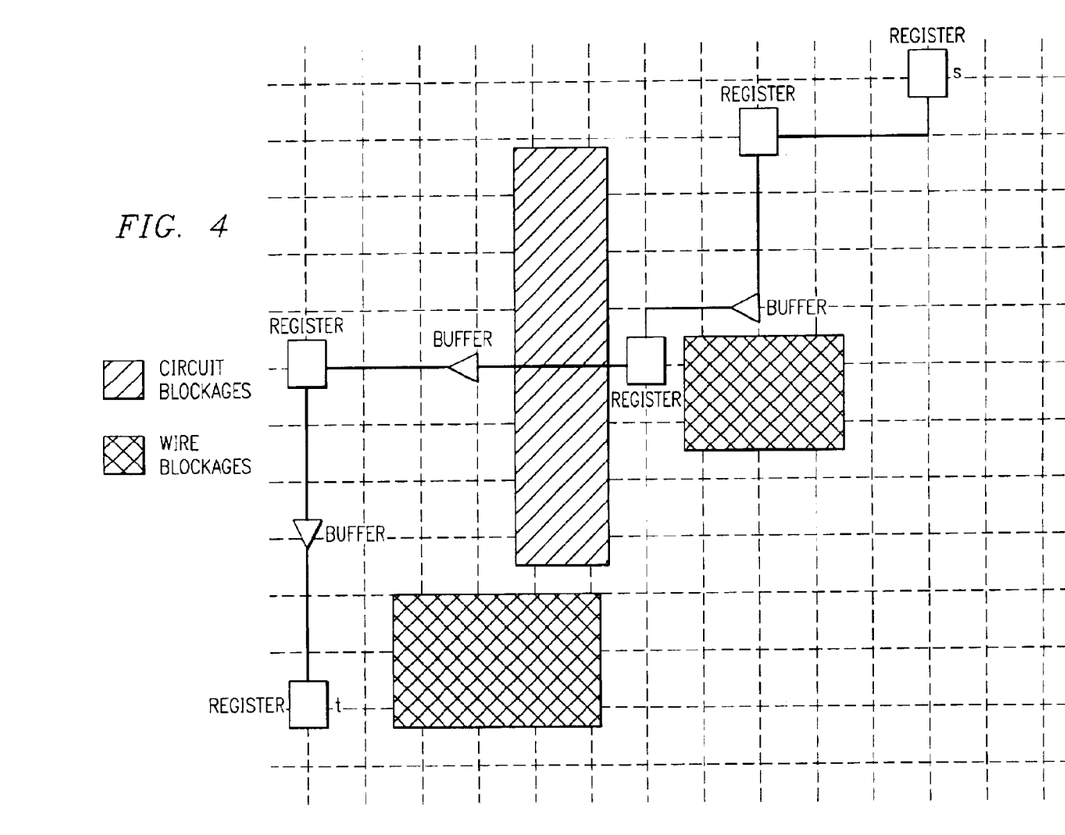
FIG. 4 is a diagram of an exemplary route containing registers and made in accordance with a preferred embodiment of the present invention.

Let r denote the register to be used for insertion, $T_\phi$ the clock period, and Setup(r) to be the setup time for r. Extending the definition of the labeling function m from that used in the Fast Path algorithm, we can allow m(v)=r for any node v∈V−{s,t}. We thus create a new set I=B∪{r}, which contains the buffer library B and the register element r. We assume that m(s)=r and m(t)=r are initially assigned. We also add the additional constraint to the definition of feasibility: a buffer-register path is feasible if and only if p(v)=1 whenever m(v)∈I and the buffered path delay between consecutive registers is less than or equal to $T_\phi$−Setup(r). Since a register will only release its signal with each clock switch, the s-t path delay is given by $T_\phi \cdot (p+1)$, where p is the number of registers on the s-t path. For example, FIG. 3 shows an s-t path with three registers between s and t, which means it takes three clock cycles to traverse between s and t. Note that in the figure the consecutive registers have different spacings, but the delay is always measured as $T_\phi$ between registers. FIG. 4 shows an example of a buffered-register path on a grid graph with both circuit and wire blockages.

The problem of finding the minimum buffer-register path from s to t can now be stated as follows: Given a routing graph G=(V,E), the set I=B∪{r}, and two nodes s,t∈V, find a feasible buffer-register path from s to t such that the latency from s to t is minimized. This objective is also equivalent to minimizing |{v|m(v)=r}|.

To solve this problem, one might initially try applying the Fast Path algorithm while simply including the register as a possible insertable element while eliminating paths that violate the register-to-register delay constraint. However, the Fast Path pruning scheme will not behave correctly.

Figure 5:
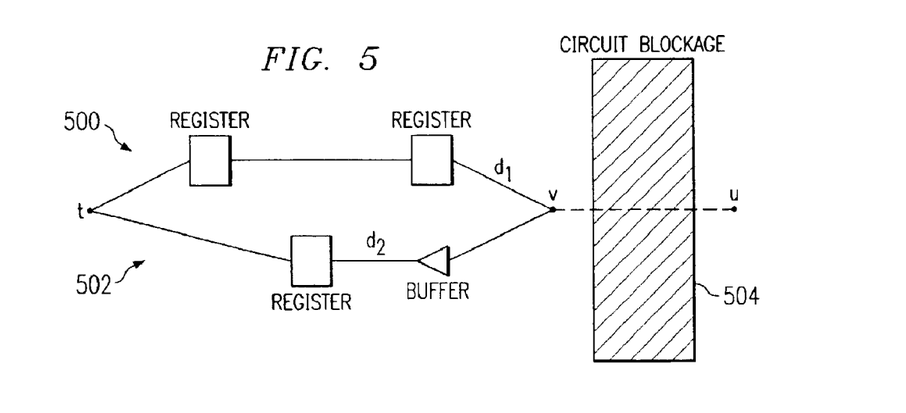
FIG. 5 is a diagram illustrating why naive application of the Fast Path algorithm to the problem of buffer-register path routing does not work.

Consider the two partial solutions from v to t in FIG. 5. Path 500 has delay $2T_\phi+d_1$, while path 502 has delay $T_\phi+d_2$. To be feasible, both $d_1$ and $d_2$ must be no greater than $T_\phi$−Setup(r), which guarantees that path 502 is faster than path 500. Further, since there is a buffer on path 502 near v, v sees less downstream capacitance on path 502 than on path 500. Given that path 500 has worse capacitance and delay, the Fast Path algorithm would prune path 500 from the possible candidates for node v. However, consider routing to node u on the other side of circuit blockage 504 from v. It is certainly possible that the delay from u to v for path 502 plus $d_2$ exceeds the register-to-register delay constraint, while the delay from u to v for path 500 plus $d_1$ does not. Hence, only path 500 can successfully be routed from v to u while still meeting feasibility requirements. Clearly, the top path cannot be pruned.

What this shows is that one can only compare subpaths with the same number of registers. In FIG. 5, comparing a path with one register with a path with two registers leads to an irresolvable inconsistency. Had path 502 had two registers, then it would not have had superior delay characteristics to path 500, and no pruning would result.

In accordance with a preferred embodiment of the present invention, therefore, only partial solutions that contain the same number of registers are allowed to populate the priority queue Q at one time. A Buffer-Register Path (BRP) algorithm in accordance with this preferred embodiment of the present invention is presented in pseudocode in Table III, below:

TABLE III

```
    BRP(G = (V,E),B,s,t,m',r,T_φ) {
1.      Q ← {C(r),Setup(r),m',t)}
        Q* = ∅,A(v) = 0,∀v ∈ V
2.      while Q ≠ ∅ or Q* ≠ ∅ {
            if Q = ∅ {
                Q = Q*, Q* = ∅
                continue
            }
3.          (c,m,b,u) ← EXTRACT_MIN(Q)
4.          if u = s {
                d' ← d + R(m(s)) . c + K(m(s))
                if d' ≤ T_φ {
                    return labeling m
                }
            }
5.          for each (u,v) ∈ E {
                c' ← c + C(u,v)
                d' ← d + R(u,v)(c + C(u,v))/2
                if d' ≤ T_φ {
```

TABLE III-continued

```
                    push (c',d',m,v) onto Q and prune
                  }
             }
   6.        if p(u) = 1 and m(u) = 0 {
   7.           for each b ∈ B {
                    c' ← C(b)
                    d' ← d + R(b) . c + K(b)
                    m(u) = b
                    if d' ≤ T_φ {
                        push (c',d',m,v) onto Q and prune
                    }
                }
   8.           if A(u) = 0 and d + R(r) . c + K(r) ≤ T_φ {
                    m(u) = r
                    A(u) = 1
                    push (C(r), Setup(r),m,u) onto Q*
                }
            }
        }
    }
```

The algorithm begins by initializing Q to hold a partial solution corresponding to the sink register alone, having initial labeling function m' representing a graph that is devoid of buffers and registers, with the exception of the source and sink circuit which are already known (step 1). Also in step 1, an additional priority queue Q* is initialized to be empty. This additional queue Q* is used to store candidates having one more register than those stored in Q. That way, only candidates having the same number of registers are compared at one time. Also in step 1, a marking array A is initialized to all zeros. Marking array A is used to store whether a "registered" solution has been generated for each node v (i.e., whether a solution has been generated in which a register is placed at node v). Each iteration (step 2), Q is checked to see if it is empty. If so, then the contents of the additional priority queue Q* is dumped into Q. Next, the candidate having the minimum delay is extracted from Q (step 3). If the source s has been reached (step 4), the feasibility of the solution is checked (i.e., the delay is checked to make sure it does not exceed the clock period $T_\phi$). If the solution is feasible, it is returned as the final solution.

If the source s has not been reached, the extracted partial solution is then extended to add possible edges, pushing each extended partial solution (extended by adding an edge adjacent to the current node) to Q (step 5). Next, a determination is made as to whether it would be possible to extend the current partial solution by placing a buffer from the library or a register at the current node (if no buffer or register has already been placed there and there is no other physical obstacle preventing placement of a buffer or register) (step 6). If it is possible to place a buffer or register, possible candidate solutions placing buffers at the current node are generated and pushed on Q (step 7). If no "registered solution" has been generated at the current node, a partial solution is generated with a register a the current node, and that partial solution is pushed onto Q* (step 8).

Let N be the number of nodes that can be reached from a given node in one clock cycle. When the clock period is sufficiently short, N<n. The complexity of the BRP algorithm in Table III is the $O(nNk^2 \log nk)$, which is a lower time complexity than that of the Fast Path algorithm. This computational savings occurs because resources do not have to be wasted in exploring the many paths that violate the clock period constraint. This speedup has been observed experimentally.

Figure 6:
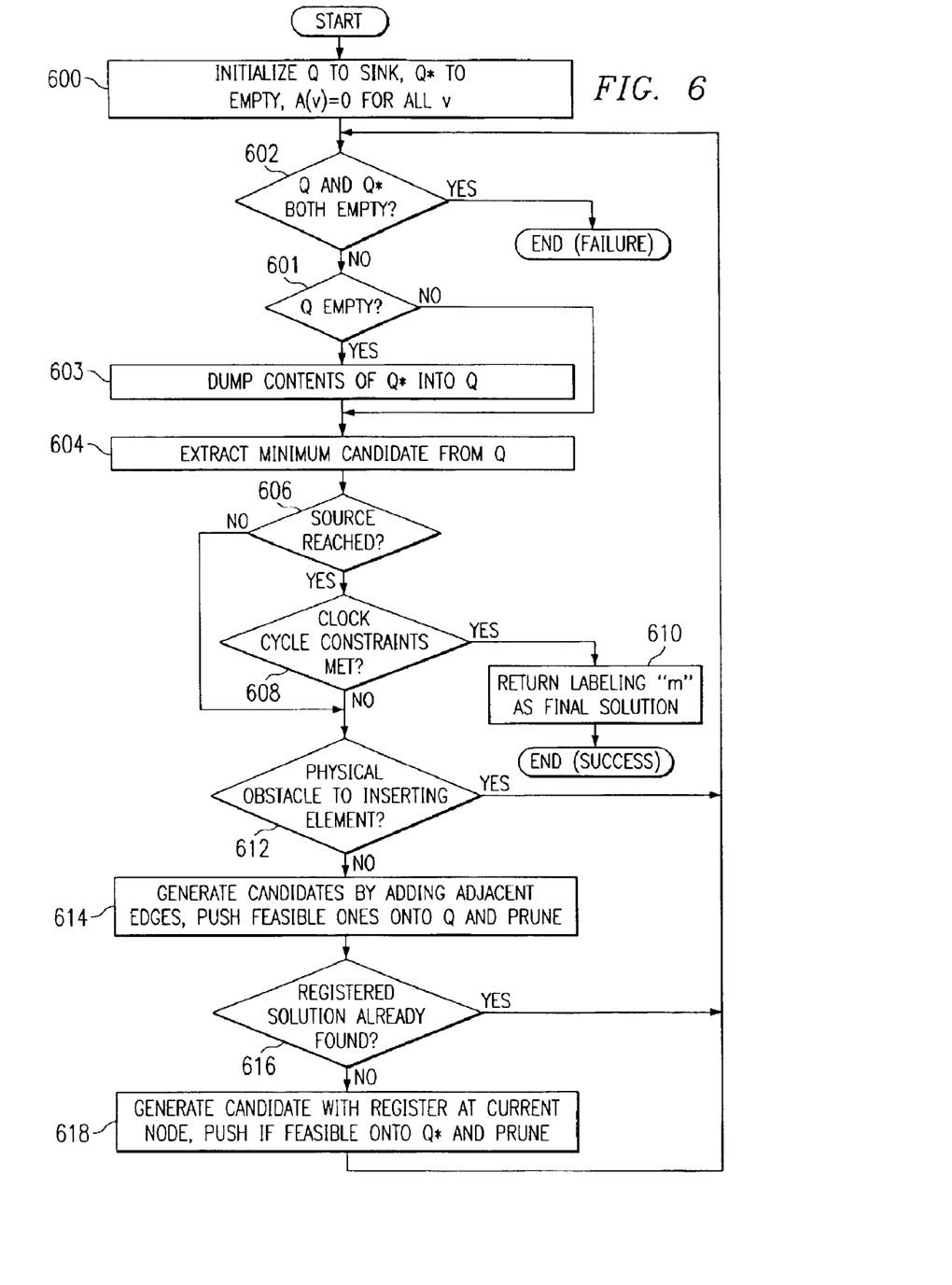
FIG. 6 is a flowchart representation of a buffer-register path (BRP) algorithm in accordance with a preferred embodiment of the present invention.

FIG. 6 is a flowchart representation of a process following the BRP algorithm in accordance with a preferred embodiment of the present invention. First, the priority queue Q is initialized to refer to only the sink node, the additional priority queue Q* is initialized to contain no candidates, and the marking array A(v) is set to all zeros (step 600). If Q and Q* are both empty (step 602:Yes), no solution is possible and the process ends in failure. If one or both contain candidates (step 602:No), however, a determination is made as to whether Q is empty (step 601). If Q is empty (step 601:Yes), then the contents of Q* are dumped into Q (step 603). In either case, the minimum-delay candidate is next extracted from Q (step 604).

If the candidate extracted from Q in step 604 is a path to the source (step 606:Yes), then a determination is made as to whether the clock cycle constraints for the given design are met (step 608). If so, then the solution is returned (step 610).

If the source was not reached (step 606:No) or the current candidate does not meet the clock cycle constraints (step 608:No), then a determination is made as to whether a physical obstacle prevents the insertion of a buffer or register (step 612). If so (step 612:Yes), then the process cycles back to step 602 for another iteration. If not (step 612:No), then new candidates are formed by adding edges adjacent to the current node to the path represented by the current candidate; those new candidates are then pushed onto Q, which is then pruned to remove inferior candidates (step 614).

Next, the value of the marking array A is checked for the current node to see if a registered solution has already been established at the current node (step 616). If so (step 616:Yes), then the process cycles to step 602 for another iteration. If not, a new candidate is generated with a register at the current node and, if feasible, pushed onto Q*, which is then pruned to remove inferior candidates (step 618). The process then cycles to step 602 for another iteration.

Multiple Clock Domain Routing

When an integrated circuit contains multiple clock domains (i.e., one portion of the circuit uses a different clock frequency than the other), routing becomes more complicated. In addition to the conventional registers used for maintaining synchronization in a single clock domain, cross-domain synchronizers must be used to maintain communications between the two clock domains. One such cross-domain synchronizer is known as a "Multi-Clock FIFO" or "MCFIFO" (with FIFO standing for First-In-First-Out-FIFO is a synonym for queue). The MCFIFO is described in T. Chelsea and S. Nowick, "Robust Interfaces for Mixed-Timing Systems with Application to Latency-Insensitive Protocols," in *Proc. of the ACM/IEEE Design Automation Conference (DAC)*, pp. 21–26 (2001), which is hereby incorporated by reference.

Figure 7:
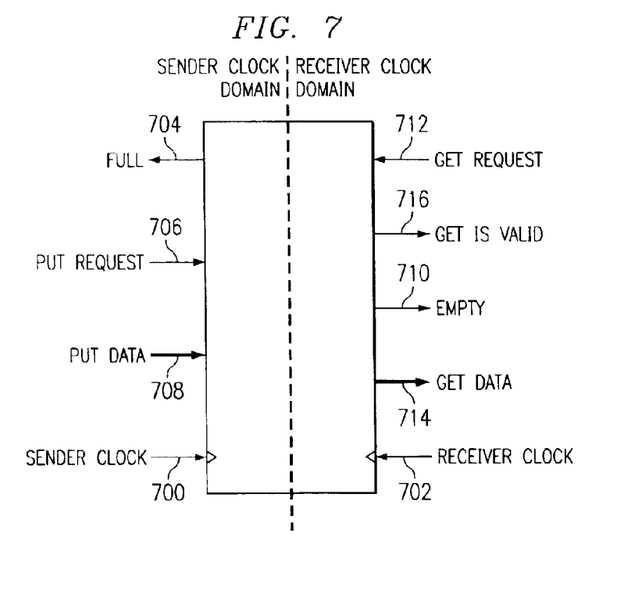
FIG. 7 is a diagram of a Multi-Clock FIFO (MCFIFO) in accordance with a preferred embodiment of the present invention.

Like all FIFOs, the MCFIFO has a "put" interface to the sender and a "get" interface to the receiver. Each interface is clocked by the communicating domain's clock (Sender Clock 700, Receiver Clock 702) as illustrated in FIG. 7. If Full signal 704 is not asserted, then the sender can request a put (Put Request signal 706) and data is placed on Put Data wires 708. The data is latched into the FIFO at the next edge of Sender Clock 700. If Empty signal 710 is not asserted, then the receiver can request data via Get Request signal 712. The data is then made available at Get Data wires 714 on the next clocking edge of Receiver Clock 702. Get is valid signal 716 indicates whether the data on Get Data lines 714 is valid.

Because it may take more than one sender clock cycle to route a net from its source in the routing grid to the MCFIFO, and more than one receiver clock cycle to route the net from the MCFIFO to the sink, signals must be synchronized to the clock of each domain. Chelcea and Nowick extended the concept of a single-domain relay station to do so. These stations essentially allow breaking long wires into segments that correspond to clock cycles, thus making a chain of relay stations act like a distributed FIFO.

Figure 8:
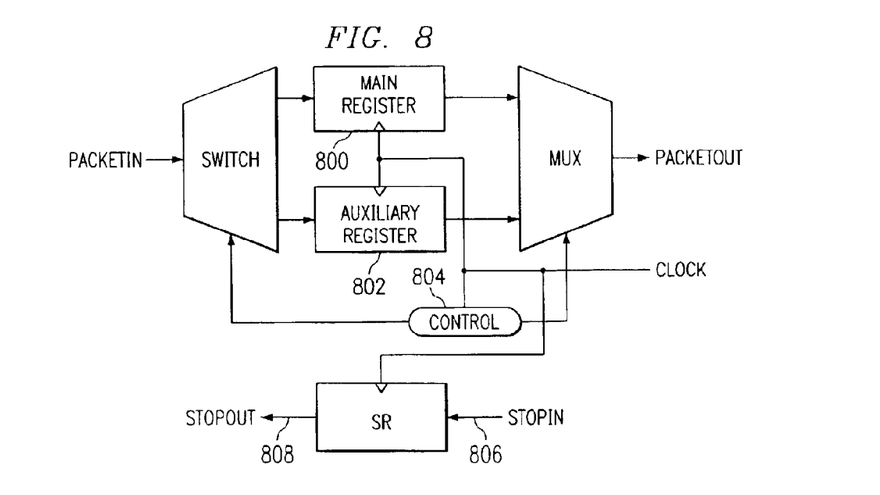
FIG. 8 is a diagram of a single-domain relay station in accordance with a preferred embodiment of the present invention.

Single-domain relay stations are described in L. Carloni, K. McMillan, A. Saldanha, and A. Sangiovanni-Vincentelli, "A Methodology for Correct-by-Construction Latency Insensitive Design," in *Proc. of the IEEE International Conference on Computer-Aided Design (ICCAD)*, 1999, which is incorporated by reference. A single-domain relay station is shown in FIG. 8. It contains a main register 800 and an auxiliary register 802. Initially, both main register 800 and auxiliary register 802 are empty and control 804 selects main register 800 for storing and reading a packet. When StopIn signal 806 is asserted, the next incoming packet is stored in auxiliary register 802. StopOut signal 808 is asserted on the next clock cycle to indicate that the relay station is full and cannot further accept new data.

Figure 9:
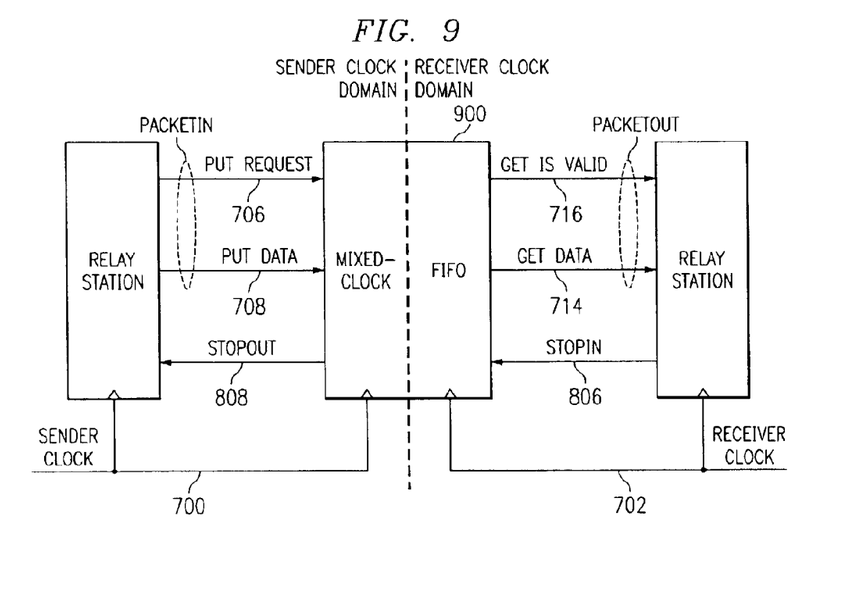
FIG. 9 is a diagram of an MCFIFO utilizing single-domain relay stations in accordance with a preferred embodiment of the present invention.

To adapt the single-domain relay stations to interface properly with the MCFIFO, the relay stations are made to bundle Put Request signal 706 and Put Data 708 (FIG. 7) as the incoming packet, and Get Is Valid signal 716 and Get Data signal 714 as the outgoing packet, as shown in FIG. 9. Full signal 704 in MCFIFO 900 is used to stop the incoming flow of packets.

In a preferred embodiment of the present invention, a MCFIFO configuration as shown in FIG. 9 is used to transition from one clock domain to another in a routing path. This MCFIFO configuration can be modeled as a register for delay purposes, since it has the same delay properties as a register.

Figure 10:
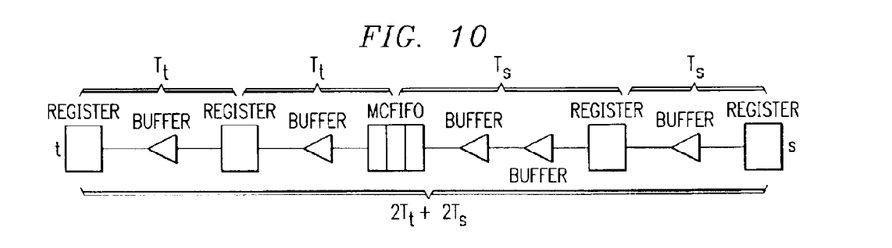
FIG. 10 is a diagram of an exemplary path containing registers and an MCFIFO.

Let f denote the MCFIFO element to be inserted, $T_s$ to be the clock period before f and $T_t$ to be the clock period after f. FIG. 10 shows an example where there are two clock periods between s and the MCFIFO 1000 and two clock periods after MCFIFO 1000. Since the clocks have different periods, the total latency is given by $2T_s+2T_t$.

The set of insertable elements I is now defined as I=B∪{r, f}. For a routing path containing an MCFIFO, the following conditions for feasibility are used: an MCFIFO path is feasible if and only if p(v)=1 whenever m(v)∈I, m(v)=f for exactly one v∈V, the buffered path delay between consecutive registers between s and f is less than or equal to $T_s$−Setup(r), and the buffered path delay between consecutive registers between f and t is less than or equal to $T_t$−Setup(r).

Figure 11:
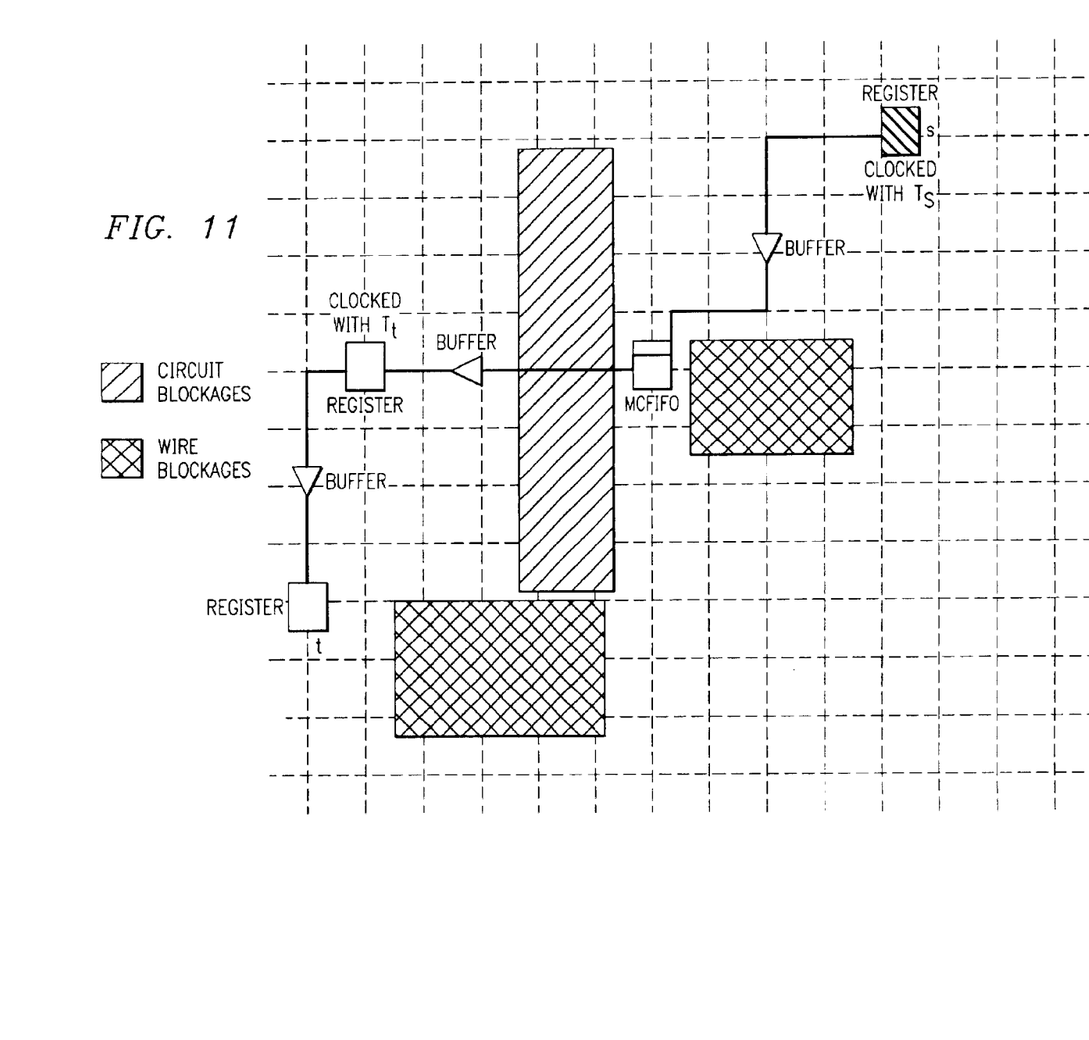
FIG. 11 is a diagram of an exemplary route containing registers and an MCFIFO and made in accordance with a preferred embodiment of the present invention.

For example, FIG. 11 shows a solution on a routing graph with a single MCFIFO having latency $T_s+2T_t$.

To achieve optimal routing in the multiple clock domain scenario, one can adopt a similar approach as in the previously described BRP algorithm, inserting a MCFIFO element for every candidate, wherever a register is inserted. We refer to this improved algorithm as the Globally Asynchronous, Locally Synchronous or GALS algorithm. There are several key modifications from the aforementioned BRP algorithm:

A GALS candidate must know if the MCFIFO has been inserted, so now a six-tuple is used, α=(c,d,b,v,z,l), where z=0 is α does not contain an MCFIFO and z=1 otherwise. Let T(0)=$T_t$ and T(1)=$T_s$ be a mapping to find the current required clock period, given a z value. The latency l is discussed below GALS pruning takes place only with candidates having the same value of z. Two candidates with differing values of z cannot be compared for pruning. Hence, each grid node now need to store two lists of candidates, one for each value of z.

Because $T_s \neq T_t$, one cannot find simply count registers to determine the overall latency (delay) of a candidate, as in BRP. For GALS, one path may have a latency $2T_s+3T_t$ while another has $T_s+4T_t$, for example. Whichever path has a smaller latency must be explored first. Thus, l stores the latency from the most recently inserted register or MCFIFO back to the sink t. As before, d stores the combinational delay from the current node to the most recently inserted register.

The elements in Q are still ordered by d, but the elements in Q* are ordered by l. We define the operation Q=EXTRACT_ALL_MIN(Q*) to pull all elements off of Q* with the same minimum key value and load them into Q. This operation extracts the next "wave front" of elements with equal latency from Q*.

In BRP, at most the first register to be inserted at a grid node v precluded the need to insert registers for any other path. BRP uses A(v)∈{0,1} to represent whether a register has been seen in a path at v. In GALS, we extend this definition so that A(0,v)∈{0,1} represents whether a register was inserted between f and t at v and A(1,v)∈{0,1} to represent whether a register was inserted between s and f at v. Also, let F(v)∈{0,1} denote whether an MCFIFO was inserted at v.

Pseudocode for the GALS algorithm is provided in Table IV below:

TABLE IV

```
    GALS(G = (V, E),B,s,t,m',r,f,T_s,T_t) {
1.      Q ← {C(r),Setup(r),m',t,0,0)}
        Q* = ∅,A(u,v) = ∅,∀u ∈ {0,1}∀v ∈ V
2.      while Q ≠ ∅ or Q* ≠ ∅ {
            if Q = ∅ {
                Q = EXTRACT_ALL_MIN(Q*)
                continue
            }
3.          (c,m,b,u,z,l) ← EXTRACT_MIN(Q)
4.          if u = s {
                d' ← d + R(m(s)) . c + K(m(s))
                if z = 1 and d' ≤ T_s {
                    return labeling m
                }
            }
5.          for each (u,v) ∈ E {
                c' ← c + C(u,v)
                d' ← d + R(u, v)(c + C(u, v))/2
                if d' ≤ T(z) {
                    push (c',d',m,v,z,l) onto Q and prune
                }
            }
6.          if p(u) = 1 and m(u) = 0 {
7.              for each b ∈ B {
                    c' ← C(b)
                    d' ← d + R(b) . c + K(b)
                    m(u) = b
                    if d' ≤ T(z) {
                        push (c', d', m, v, z, l) onto Q and prune
                    }
                }
            }
8.          if A(z,u) = 0 and d + R(r).c + K(r) ≤ T(z) {
                m(u) = r
                A(z,u) = 1
                push (C(r), Setup(r),m,u,z,l + T(z)) onto Q*
            }
```

TABLE IV-continued

```
9.          if z = 0 and F(u) = 0 and d + R(f) . c + K(f) ≦ T(z) {
                m(u) = f
                F(u) = 1
                push (C(f), Setup(f),m,u,1,l + T_t) onto Q*
            }
        }
    }
```

The algorithm begins by initializing Q to hold a partial solution corresponding to the sink register alone, having initial labeling function m' representing a graph that is devoid of buffers and registers, with the exception of the source and sink circuit which are already known (step 1). Also in step 1, an additional priority queue Q* is initialized to be empty, and the marking array A is initialized to all zeros. Each iteration (step 2), Q is checked to see if it is empty. If so, then the minimum latency elements from the additional priority queue Q* are dumped into Q. Next, the candidate having the minimum delay is extracted from Q (step 3). If the source s has been reached (step 4), the feasibility of the solution is checked (i.e., the delay is checked to make sure it does not exceed the clock period $T_s$). If the solution is feasible, it is returned as the final solution.

If the source s has not been reached, the extracted partial solution is then extended to add possible edges, pushing each extended partial solution (extended by adding an edge adjacent to the current node) to Q (step 5). Next, a determination is made as to whether it would be possible to extend the current partial solution by placing a buffer from the library, a register, or an MCFIFO (i.e., an insertable element) at the current node (if no insertable element has already been placed there and there is no other physical obstacle preventing placement of a buffer or register) (step 6). If it is possible to place an insertable element, possible candidate solutions placing buffers at the current node are generated and pushed on Q (step 7). If no "registered solution" has been generated at the current node, a partial solution is generated with a register at the current node, and that partial solution is pushed onto Q* (step 8). If no MCFIFO has been placed in the current partial solution, a new partial solution with a MCFIFO at the current node is generated and pushed onto Q* (step 9).

Figure 12:
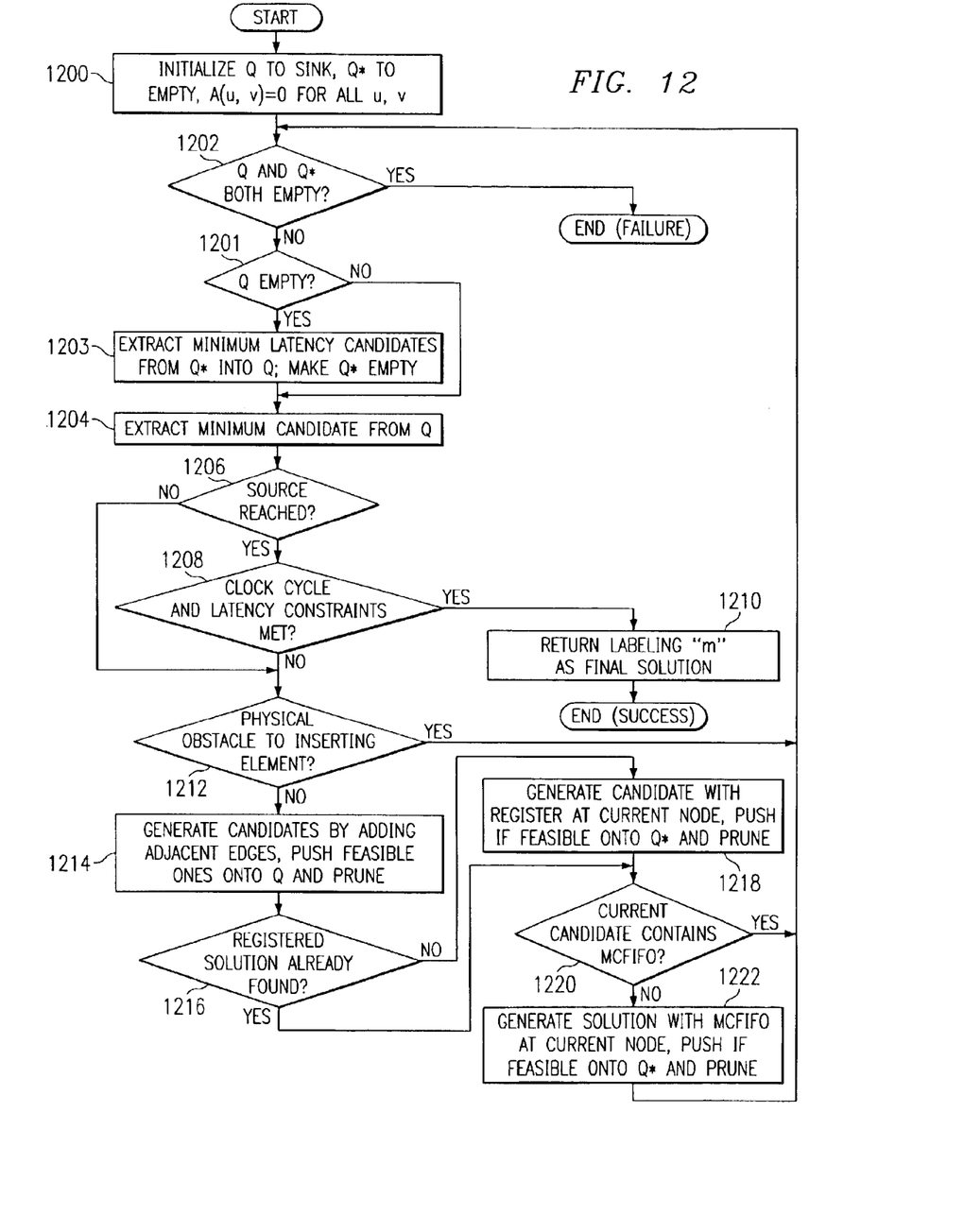
FIG. 12 is a flowchart representation of a globally asynchronous, locally synchronous (GALS) algorithm in accordance with a preferred embodiment of the present invention.

FIG. 12 is a flowchart representation of a process following the GALS algorithm in accordance with a preferred embodiment of the present invention. First, the priority queue Q is initialized to refer to only the sink node, the additional priority queue Q* is initialized to contain no candidates, and the marking array A(u,v) is set to all zeros (step 1200). If Q and Q* are both empty (step 1202:Yes), no solution is possible and the process ends in failure. If one or both contain candidates (step 1202:No), however, a determination is made as to whether Q is empty (step 1201). If Q is empty (step 1201:Yes), then the minimum-latency candidates from extracted into Q and Q* is made empty (step 1203). In either case, the minimum-delay candidate is next extracted from Q (step 1204).

If the candidate extracted from Q in step 1204 is a path to the source (step 1206:Yes), then a determination is made as to whether the clock cycle and latency constraints for the current clock domain are met (step 1208). If so, then the solution is returned (step 1210).

If the source was not reached (step 1206:No) or the current candidate does not meet the clock cycle or latency constraints (step 1208:No), then a determination is made as to whether a physical obstacle prevents the insertion of a buffer, register, or MCFIFO (or other suitable cross-domain synchronization element) (step 1212). If so (step 1212:Yes), then the process cycles back to step 1202 for another iteration. If not (step 1212:No), then new candidates are formed by adding edges adjacent to the current node to the path represented by the current candidate; those new candidates are then pushed onto Q, which is then pruned to remove inferior candidates (step 1214).

Next, the value of the marking array A is checked for the current node to see if a registered solution has already been established at the current node (step 1216). If so (step 1216:Yes), then the process cycles to step 1202 for another iteration. If not, a new candidate is generated with a register at the current node and, if feasible, pushed onto Q*, which is then pruned to remove inferior candidates (step 1218). The process then cycles to step 1202 for another iteration.

Next, a determination is made as to whether the current candidate contains an MCFIFO or other suitable cross-domain synchronization element (step 1220). If so (step 1220:Yes), then the process simply cycles to step 1202 for another iteration. If not (step 1220:No), a candidate containing an MCFIFO (or other suitable cross-domain synchronization element) is generated and, if feasible, pushed onto Q*, which is then pruned to remove inferior candidates (step 1222). The process then cycles to step 1202 for another iteration.

It is important to note that while the present invention has been described in the context of a fully functioning data processing system, those of ordinary skill in the art will appreciate that the processes of the present invention are capable of being distributed in the form of a computer readable medium of instructions or other functional descriptive material and in a variety of other forms and that the present invention is equally applicable regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system. Functional descriptive material is information that imparts functionality to a machine. Functional descriptive material includes, but is not limited to, computer programs, instructions, rules, facts, definitions of computable functions, objects, and data structures.

The description of the present invention has been presented for purposes of illustration and description, and is not intended to be exhaustive or limited to the invention in the form disclosed. Many modifications and variations will be apparent to those of ordinary skill in the art.

For example, the teachings of the present invention, although described herein with respect to integrated circuit routing, could be applied to other problem domains requiring the routing of electrical signals in a wiring plane, such as a printed circuit layout. In addition, because possible wiring routes are represented by a graph data structure, the techniques of the present invention are not confined to a two-dimensional orthogonal wiring plane, but may be applied to three-dimensional wiring arrangements of arbitrary size and shape, such as wiring in a building or over a large geographic area. For example, the teachings of the present invention may be applied to the routing, buffering, and synchronization of network, telephone, or cable television connections in a home, an office building, or even over an entire city.

The embodiment was chosen and described in order to best explain the principles of the invention, the practical application, and to enable others of ordinary skill in the art to understand the invention for various embodiments with various modifications as are suited to the particular use contemplated.

What is claimed is:

1. A method comprising:
   receiving a location of a source node and a location of a sink node; and
   in response to receiving the location of the source node and the location of the sink node, generating a minimum-delay routing path from the source node to the sink node, wherein the minimum-delay routing path contains buffers and synchronization elements.

2. The method of claim 1, wherein the synchronization elements include registers.

3. The method of claim 2, wherein the synchronization elements include cross-domain synchronization elements.

4. A method comprising:
   establishing a first priority queue and a second priority queue;
   extracting a minimum-delay candidate from the first priority queue to be a current candidate, wherein the current candidate represents a current path and a current node;
   generating a first at least one new candidate by adding edges to the current path;
   pushing the first at least one new candidate to the first priority queue;
   generating a second at least one new candidate containing a register at the current node;
   pushing the second at least one new candidate to the second priority queue; and
   in response to the first priority queue becoming empty, moving candidates from the second priority queue onto the first priority queue.

5. The method of claim 4, wherein moving candidates from the second priority queue onto the first priority queue includes:
   emptying all candidates from the second priority queue into the first priority queue.

6. The method of claim 4, wherein moving candidates from the second priority queue onto the first priority queue includes:
   extracting candidates representing minimum-latency paths from the second priority queue;
   pushing the candidates representing minimum-latency paths onto the first priority queue; and
   emptying the second priority queue.

7. The method of claim 4, further comprising:
   generating a third at least one candidate containing a cross-domain synchronization element at the current node; and
   pushing the third at least one candidate onto the second priority queue.

8. The method of claim 4, further comprising:
   pruning inferior candidates from the first priority queue, whereby a search space is reduced.

9. The method of claim 4, further comprising:
   pruning inferior candidates from the second priority queue, whereby a search space is reduced.

10. A computer program product in at least one computer-readable medium comprising functional descriptive material that, when executed by a computer, enables the computer to perform acts including:
    receiving a location of a source node and a location of a sink node; and
    in response to receiving the location of the source node and the location of the sink node, generating a minimum-delay routing path from the source node to the sink node, wherein the minimum-delay routing path contains buffers and synchronization elements.

11. The computer program product of claim 10, wherein the synchronization elements include registers.

12. The computer program product of claim 11, wherein the synchronization elements include cross-domain synchronization elements.

13. A computer program product in at least one computer-readable medium comprising functional descriptive material that, when executed by a computer, enables the computer to perform acts including:
    establishing a first priority queue and a second priority queue;
    extracting a minimum-delay candidate from the first priority queue to be a current candidate, wherein the current candidate represents a current path and a current node;
    generating a first at least one new candidate by adding edges to the current path;
    pushing the first at least one new candidate to the first priority queue;
    generating a second at least one new candidate containing a register at the current node;
    pushing the second at least one new candidate to the second priority queue; and
    in response to the first priority queue becoming empty, moving candidates from the second priority queue onto the first priority queue.

14. The computer program product of claim 13, wherein moving candidates from the second priority queue onto the first priority queue includes:
    emptying all candidates from the second priority queue into the first priority queue.

15. The computer program product of claim 13, wherein moving candidates from the second priority queue onto the first priority queue includes:
    extracting candidates representing minimum-latency paths from the second priority queue;
    pushing the candidates representing minimum-latency paths onto the first priority queue; and
    emptying the second priority queue.

16. The computer program product of claim 13, comprising additional functional descriptive material that, when executed by the computer, enables the computer to perform additional acts including:
    generating a third at least one candidate containing a cross-domain synchronization element at the current node; and
    pushing the third at least one candidate onto the second priority queue.

17. The computer program product of claim 13, comprising additional functional descriptive material that, when executed by the computer, enables the computer to perform additional acts including:
    pruning inferior candidates from the first priority queue, whereby a search space is reduced.

18. The computer program product of claim 13, comprising additional functional descriptive material that, when executed by the computer, enables the computer to perform additional acts including:

pruning inferior candidates from the second priority queue, whereby a search space is reduced.

19. A data processing system comprising:

memory;

at least one processor in communication with the memory; and a set of instructions in the memory, wherein the at least one processor executes the set of instructions to perform acts including:

receiving a location of a source node and a location of a sink node; and in response to receiving the location of the source node and the location of the sink node, generating a minimum-delay routing path from the source node to the sink node, wherein the minimum-delay routing path contains buffers and synchronization elements.

20. The data processing system of claim 19, wherein the synchronization elements include registers.

21. The data processing system of claim 20, wherein the synchronization elements include cross-domain synchronization elements.

22. A data processing system comprising:

memory;

at least one processor in communication with the memory; and a set of instructions in the memory, wherein the at least one processor executes the set of instructions to perform acts including:

establishing a first priority queue and a second priority queue;

extracting a minimum-delay candidate from the first priority queue to be a current candidate, wherein the current candidate represents a current path and a current node;

generating a first at least one new candidate by adding edges to the current path;

pushing the first at least one new candidate to the first priority queue;

generating a second at least one new candidate containing a register at the current node;

pushing the second at least one new candidate to the second priority queue; and in response to the first priority queue becoming empty, moving candidates from the second priority queue onto the first priority queue.

23. The data processing system of claim 22, wherein moving candidates from the second priority queue onto the first priority queue includes:

emptying all candidates from the second priority queue into the first priority queue.

24. The data processing system of claim 22, wherein moving candidates from the second priority queue onto the first priority queue includes:

extracting candidates representing minimum-latency paths from the second priority queue;

pushing the candidates representing minimum-latency paths onto the first priority queue; and emptying the second priority queue.

25. The data processing system of claim 22, wherein the at least one processor executes the set of instructions to perform additional acts including:

generating a third at least one candidate containing a cross-domain synchronization element at the current node; and pushing the third at least one candidate onto the second priority queue.

26. The data processing system of claim 22, wherein the at least one processor executes the set of instructions to perform additional acts including:

pruning inferior candidates from the first priority queue, whereby a search space is reduced.

27. The data processing system of claim 22, wherein the at least one processor executes the set of instructions to perform additional acts including:

pruning inferior candidates from the second priority queue, whereby a search space is reduced.

* * * * *